United States Patent [19]

Porter

[11] Patent Number: 4,907,977

[45] Date of Patent: Mar. 13, 1990

[54] COMPUTER BACKPANEL INVERSION COUPLER

[75] Inventor: Warren W. Porter, Escondido, Calif.

[73] Assignee: NCR Corporation, Dayton, Ohio

[21] Appl. No.: 258,260

[22] Filed: Oct. 14, 1988

[51] Int. Cl.⁴ .............................................. H05K 1/07
[52] U.S. Cl. ...................................... 439/74; 439/629
[58] Field of Search ................. 439/59, 60, 61, 62, 439/64, 65, 74, 75, 78, 79, 80, 629, 638; 361/413, 412

[56] References Cited

U.S. PATENT DOCUMENTS

| | | | |
|---|---|---|---|
| 3,963,300 | 6/1976 | Patton et al. | 439/638 |
| 4,072,390 | 2/1978 | Fox | 439/498 |
| 4,094,568 | 6/1978 | Lee et al. | 439/74 |
| 4,220,382 | 9/1980 | Ritchie et al. | 439/61 |
| 4,232,924 | 11/1980 | Kline et al. | 439/74 |
| 4,367,908 | 1/1983 | Johnston | 439/638 |
| 4,460,234 | 7/1984 | Bogese | 439/188 |
| 4,568,134 | 2/1986 | DiMondi | 439/64 |
| 4,686,607 | 8/1987 | Johnson | 439/75 |
| 4,692,120 | 9/1987 | Feinstein | 439/62 |
| 4,703,394 | 10/1987 | Petit et al. | 439/65 X |
| 4,715,819 | 12/1987 | Iwasa et al. | 439/65 |

Primary Examiner—William Briggs
Attorney, Agent, or Firm—Wilbert Hawk, Jr.; Stephen F. Jewett; Douglas S. Foote

[57] ABSTRACT

An inversion coupler for use in a computer system is disclosed. The computer system has a backpanel with a front side for the mounting of printed circuit boards each with a plurality of rows of connector pins. The inversion coupler mounts one of the printed circuit boards to the back side of the backpanel. The inversion coupler comprises first and second connector bodies. The first body is engageable with the pins of the board mountable to the back side and the second body is connectable to the pins of a board mountable to the front side. Each of the connector bodies has a plurality of IC pins arranged in a plurality of mutually corresponding rows. The pins in each row are connected to the pins in the corresponding row in inverse order.

19 Claims, 4 Drawing Sheets

COMPUTER BACKPANEL INVERSION COUPLER

The present invention relates to a computer system having a plurality of printed circuit boards connected to a backpanel. More particularly, it relates to a coupler for allowing circuit boards to be mounted from the back as well as the front side of the backpanel.

BACKGROUND OF THE INVENTION

Most midsize to large computer systems have multiple printed circuit boards which must be electrically interconnected and compactly packaged. A typical such system has a "backpanel" which is a multilayered panel with certain layers having interconnecting conductors and other layers providing power and ground connections. It is known to connect each printed circuit board to the backpanel with a connector. The connector is attached to one end of the board and has a plurality of pins electrically connected to and extending away from the board. The pins are arranged in a matrix with multiple rows. For example, a connector may have its pins arranged in forty rows with three pins per row. The backpanel has circuit board to be mounted thereon. The pins extend through the holes in the backpanel making contact with selected conductors in the backpanel.

Printed circuit boards are normally positioned side-by-side with minimal clearance therebetween for compact packaging and reduced path lengths for electrical signals. This close spacing of boards mounted to the backpanel does not lend itself to modifications of the printed circuit boards that may produce lateral projections therefrom. For example, the cryogenic cooling of selected board components is impractical in the narrow confines between adjacent boards.

The close spacing of boards creates a diagnostic dilemma as well. In the past, boards that needed to be tested during operation would be unplugged from the backpanel and an extender board inserted between it and the backpanel so that individual board components could be monitored and tested. However, with ever increasing system speeds these extender boards create time delays by virtue of increased path lengths. This complicates component evaluation.

OBJECTS OF THE INVENTION

It is therefore an object of the present invention to provide a new and improved coupler for connecting a printed circuit board to the backside of a backpanel.

It is another object of the present invention to provide a new and improved coupler for a backpanel which allows printed circuit boards to be mounted from either one or both sides of the backpanel.

It is yet another object o[the present invention to provide a new and improved coupler for connecting a printed circuit board, having laterally projecting elements, to a backpanel.

SUMMARY OF THE INVENTION

The present invention is an inversion coupler for use in a computer system. The computer system has a backpanel with a front side for the mounting of printed circuit boards. Each printed circuit board has a plurality of rows of connector pins which are connected to the backpanel through a connector. The inversion coupler mounts one of the printed circuit boards to the back side of the backpanel.

The inversion coupler comprises first and second connector bodies. The first body is engageable with the pins of the board mountable to the back side of the backpanel, and the second body is connectable to the pins of a connector which mount a board to the front side of the backpanel and which extend through the board. Each of the connector bodies has a plurality of pins arranged in a plurality of mutually corresponding rows. The pins in each row are connected to the pins in the corresponding row in inverse order.

DETAILED DESCRIPTION OF THE INVENTION

Figure 1:
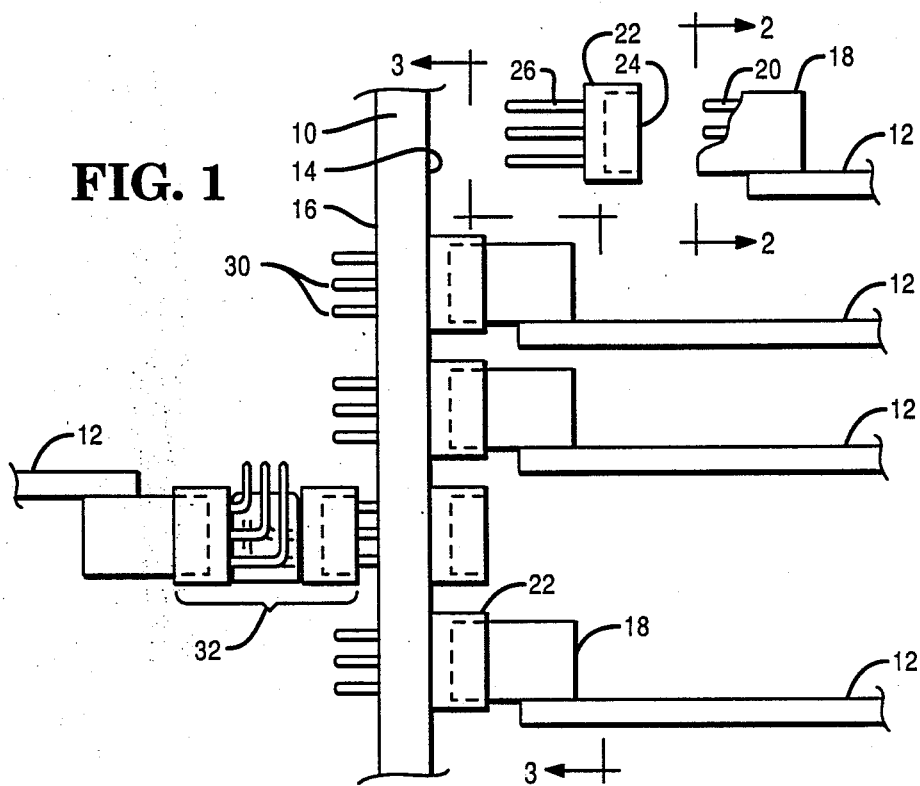
FIG. 1 is a partially exploded schematic view of several printed circuit boards connected to the front side of a backpanel, and a printed circuit board mounted to the back side of the panel by an inversion coupler according to one form of the present invention.

FIG. 1 shows a backpanel 10 such as may be used in a computer to mount a plurality of printed circuit boards 12. Backpanel 10 has front and back sides 14 and 16, respectively. Each printed circuit board 12 has a connector 18 (hereinafter referred to as PCB connector 18) attached to one end of the board 12. PCB connector 18 provides electrical connections for board 12 through a plurality of pins 20 (hereinafter referred to as PCB pins 20) which extend oppositely away from board 12.

Figure 2:
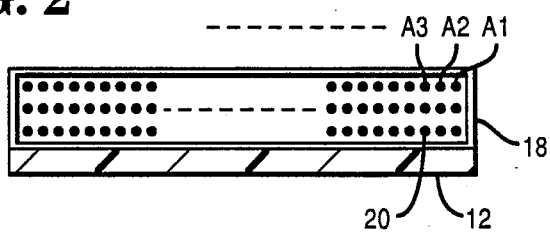
FIG. 2 is a view taken along the line 2—2 in FIG. 1.

FIG. 2 is an end view of PCB connector 18 showing PCB pins 20. PCB pins 20 are configured in a plurality of rows A1, A2, A3, etc. Each row has three pins in accordance with a preferred embodiment. However, the invention applies equally to configurations with two or more pins per row.

Referring back to FIG. 1, a plurality of backpanel connectors 22 are shown. Each backpanel connector 22 has a socket 24 on one side which receives and is engageable with PCB pins 20. On the side opposite socket 24 backpanel connector 22 has a plurality of backpanel connector pins 26 (hereinafter referred to as BP pins 26) extending away from but generally in the same direction, when assembled, as PCB pins 20. The configuration of BP pins 26 is the same as PCB pins 20 with a similar number of rows and pins per row.

Figure 3:
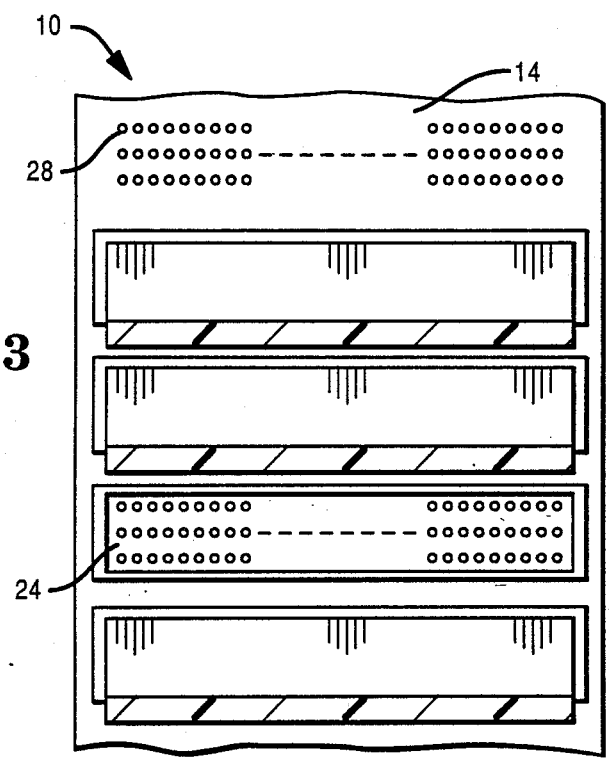
FIG. 3 is a view taken along the line 3—3 in FIG. 1.

Backpanel 10 is multilayered (the layers are not shown) with certain layers having interconnecting conductors and other layers providing power and ground connections. Referring to FIG. 3, backpanel 10 has a plurality of holes 28 extending therethrough for receiving backpanel connector pins 26 from its front side 14. Referring back to FIG. 1, when BP pins 26 are inserted, or press fitted, into backpanel 10 they extend through backpanel 10 and their ends 30 extend out of backside 16. Each pin 26 may make electrical contact with an interconnecting conductor, power or ground within backpanel 10 depending upon the internal design of backpanel 10.

FIG. 1 also shows an inversion coupler 32 for connecting BP ends 30 to a printed circuit board 12 and mounting that board 12 to the backside 16 of backpanel 10. Inversion coupler 32 will be discussed more fully hereinafter; however, at this point it will be noted that there is no printed circuit board 12 shown inserted into the front side 14 of backpanel 10 opposite inversion coupler 32. However, another printed circuit board 12 could be inserted into the open slot depending upon how the invention will be utilized. Furthermore, more than one inversion coupler 32 may be connected to the back side 16 of backpanel 10.

Figure 4:
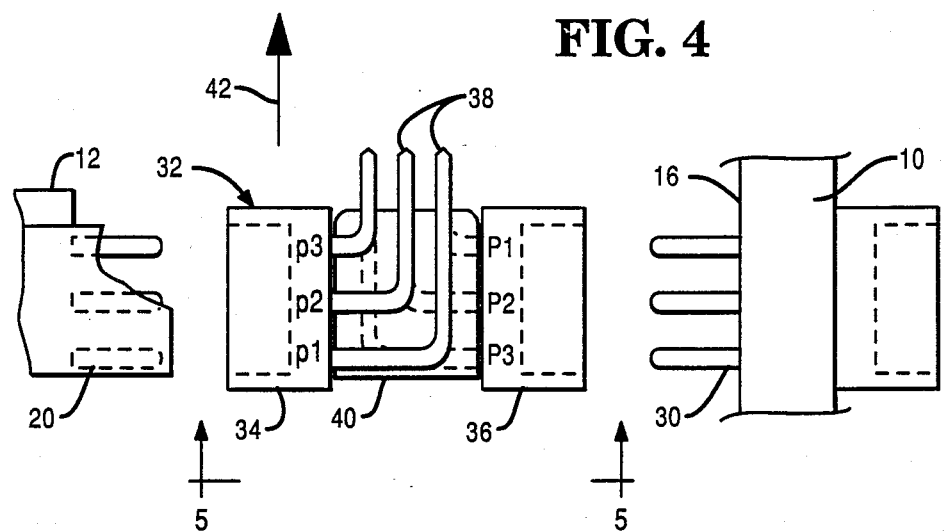
FIG. 4 is an enlarged view of the inversion coupler shown in FIG. 1.

FIG. 4 shows an enlarged view of inversion coupler 32, which is shown separated from and between printed circuit board 12 and backpanel 10 of FIG. 1. Inversion coupler 32 includes first and second connector bodies 34 and 36, respectively. First connector body 34 is engageable with PCB pins 20 and second connector body 36 is engageable with BP pin ends 30 by means similar to that previously described for the connection of PCB pins 20 to backpanel connector socket 24.

Figure 5:
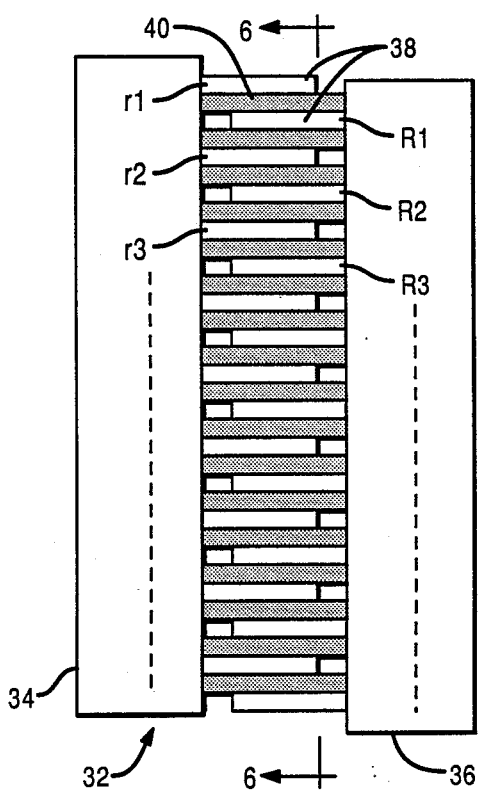
FIG. 5 is a view of the inversion coupler taken along the line 5—5 in FIG. 4.
Figure 6:
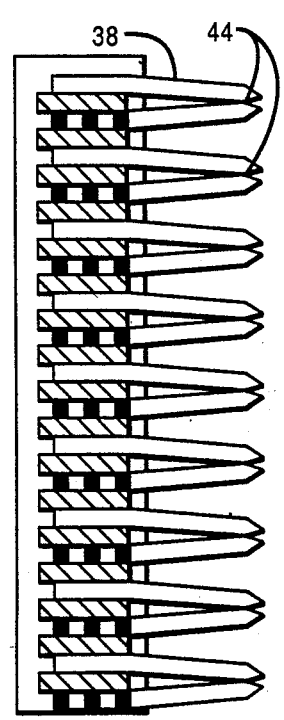
FIG. 6 is a view of the inversion coupler taken along the line 6—6 in FIG. 5.

FIG. 5 shows a side view of the inversion coupler 32 shown in FIG. 4. Each of the connectors 34 and 36 has a plurality of inversion coupler pins 38 (hereinafter referred to as IC pins 38) arranged in a plurality of rows. Each pin row r1, r2, r3, etc., on connector 34 corresponds to a pin row R1, R2, R3, etc, on connector 36. Each pair of corresponding rows generally oppose each other but are offset slightly in the vertical direction. Referring to FIGS. 4 and 5, the IC pins 38 in each row are connected to the pins in the corresponding row in inverse order to how they face each other. For example, corresponding rows r1 and R1 generally oppose each other. The top right pin p1 (as viewed from connector body 34) in row r1 is connected to the top right pin P1(as viewed from connector body 36) in row R1, the middle pin p2 in row r1 is connected to the middle pin P2 in row R1, and the top left pin p3 in row r1 is connected to the top left pin P3 in row R1.

As noted previously, the invention applies equally to connector bodies for receiving a matrix of pins configured in a plurality of rows with two or more pins per row. Restated, the invention applies to N pins per row where N is an integer greater than one. Thus, the first pin 38 in each row on first connector body 34 generally faces the Nth pin in the corresponding row on second connector body 36, the second pin 38 faces the $(N-1)$th pin, and so forth, with the Nth pin in each row on first connector body 34 generally facing the first pin in the corresponding row on second connector body 36. The Ith pin on each row faces the $(N+1-I)$th pin on the corresponding row and is connected to the Ith pin on the corresponding row.

The pins 38 in each row generally lie in and define a plane. For example, the pins p1, p2 and p3 in row r1 on connector body 34 define a first plane. Similarly, the pins p1, p2 and p3 in each of rows r2, r3, etc., define parallel first planes. Likewise, the pins P1, P2 and P3 in each of rows R1, R2, etc., define second planes. The first and second planes are parallel but interleaved so that corresponding rows of IC pins are offset.

The IC pins 38 on each connector 34 and 36 are bent to simplify the construction of inversion coupler 32 and to provide access for further electrical connection to the attached printed circuit board(s) 12. Each IC pin 38 on first connector 34 is bent so that its pin end points in a first direction (shown by arrow 42 in FIG. 4). Similarly, each corresponding IC pin on second connector 36 is bent so that its pin end also points generally in the same first direction.

The interleaved first and second planes are further interleaved with a plurality of insulating sheets 40 which prevent the Ith IC pin 38 in each row on first connector body 34 from electrically contacting all but the Ith IC pin 38 in the corresponding row on the second connector body 36. Insulating sheets 40 extend lengthwise from first connector body 34 to second connector body 36 and widthwise from pins p1 and P3 to pins p3 and P1. In general, insulating sheets 40 extend widthwise from corresponding first and Nth pins to corresponding Nth and first pins on first and second connector bodies 34 and 36, respectively. In a preferred embodiment, the insulating sheets consist of an epoxy resin which in the disclosed configuration provides strength and electrical insulation. The ends of IC pins 38 extend beyond insulating sheets 40 to contact points 44 (FIG. 5) where their ends are connected. It should be noted that in order for the IC pins 38 to be soldered or otherwise attached at contact points 44 it is necessary to slightly bend one or both of the pins 38 out of the respective plane partially defined by that pin.

Figure 7:
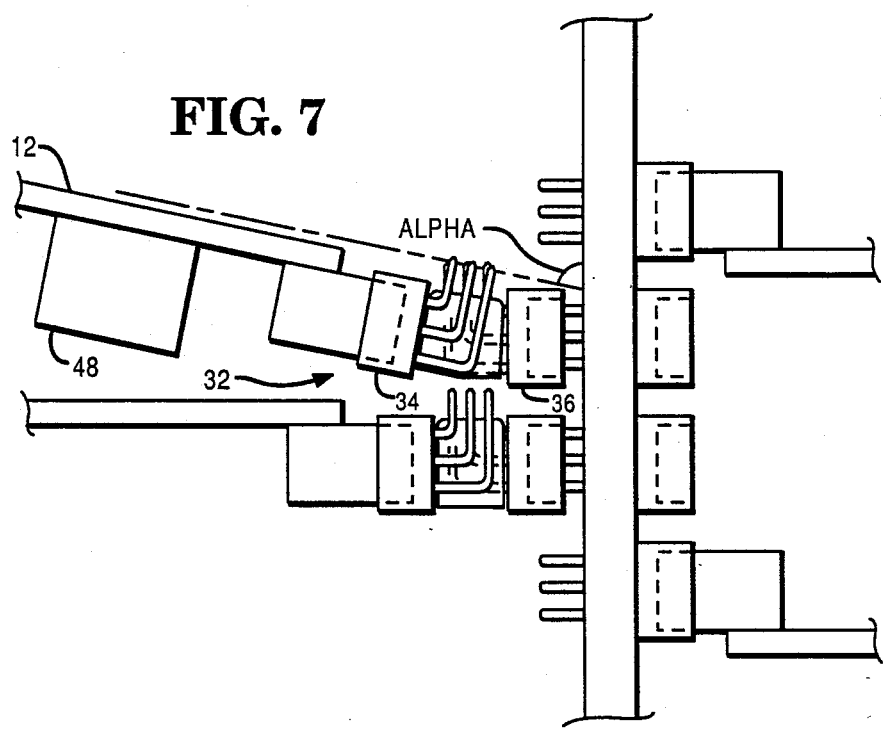
FIG. 7 is a view, similar to FIG. 1, showing an inversion coupler according to another form of the present invention.
Figure 8:
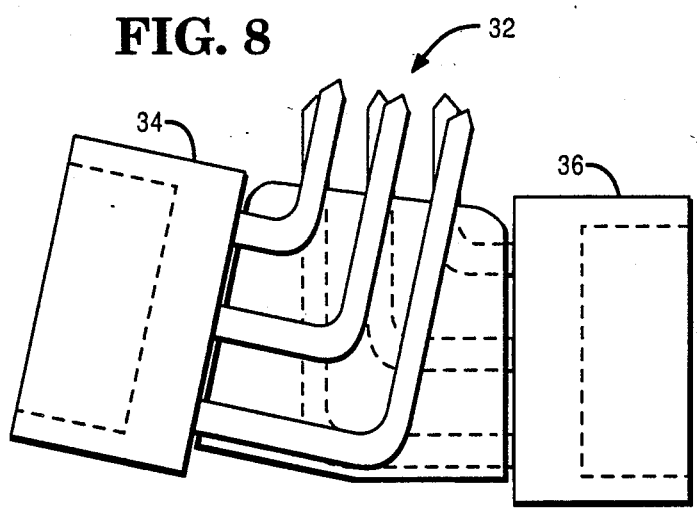
FIG. 8 is an enlarged view of the inversion coupler of FIG. 7.

Referring again to FIG. 4, connector bodies 34 and 36 are generally aligned so that printed circuit board 12 is approximately normal to backpanel 10. FIGS. 7 and 8 show an alternative embodiment of the present invention wherein the connector bodies are angled with respect to one another. In this manner, printed circuit board 12 which is connected to inversion coupler 32 forms an angle ALPHA less than 90° with respect to backpanel 10. This allows laterally projecting modules 48 connected to printed circuit board 12 to be accommodated.

It will be clear to those skilled in the art that the present invention is not limited to the specific embodiment disclosed and illustrated herein. It will be understood that the dimensions and proportional and structural relationships shown in the drawings are illustrated by way of example only and these illustrations are not to be taken as the actual dimensions or proportional structural relationships used in the inversion coupler of the present invention.

Numerous modifications, variations, and full and partial equivalents can be undertaken without departing from the invention as limited only by the spirit and scope of the appended claims.

What is desired to be secured by Letters Patent of the United States is as follows;

1. In a computer system the improvement comprising:
   a plurality of printed circuit boards, each having a PCB connector attached to one end thereof, said connector having a plurality of PCB pins extending oppositely away from said board, said pins being configured in a plurality of rows;
   a plurality of backpanel connectors, each having a socket on one side engageable with the PCB pins of a circuit board and having a plurality of BP pins on the opposite side extending away from the PCB pins, wherein said BP pins have the same configuration as said PCB pins;
   a backpanel with a front and back side and having a plurality of holes extending therethrough for receiving said BP pins from the front side, wherein said BP pins extend through said backpanel and their ends extend out the back side of said backpanel; and an inversion coupler for connecting said BP pin ends to a printed circuit board and mounting said board to the back side of said backpanel.

2. The improvement of claim 1 wherein said inversion coupler includes first and second connector bodies, said first body being engageable with the PCB pins of a board and said second body being engageable with said BP pin ends, wherein each of said connector bodies has a plurality of IC pins arranged in a plurality of mutually corresponding rows, and wherein the pins in each row are connected to the pins in the corresponding row in inverse order.

3. The improvement of claim 2 wherein the IC pins in each row on said first and second connector bodies define first planes and second planes, respectively, and wherein said first and second planes are interleaved so that corresponding rows of IC pins are offset.

4. The improvement of claim 3 wherein each row of IC pins has N pins, where N is an integer greater than one, and wherein the first pin in each row on said first connector body generally faces the Nth pin in the corresponding row on said second connector body, the second pin generally faces the (N−1)th pin, and so forth, and wherein each IC pin on said first connector is bent so that its pin end points in a first direction and each corresponding IC pin on said second connector is bent so that its pin end also points generally in said first direction.

5. The improvement of claim 4 wherein said connector bodies are generally aligned so that a printed circuit board connected to said inversion coupler is approximately normal to said backpanel.

6. The improvement of claim 4 wherein said connector bodies are angled with respect to one another so that a printed circuit board connected to said inversion coupler is angled with respect to said backpanel.

7. The improvement of claim 4 wherein said inversion coupler further includes means for preventing said Ith IC pin in each row on said first connector body from electrically contacting all but said Ith IC pin in each corresponding row on said second connector body.

8. The improvement of claim 7 wherein said means includes a plurality of insulating sheets interleaved with said first and second planes and wherein the ends of said IC pins extend beyond said sheets to where said IC pins are connected.

9. The improvement of claim 8 wherein said insulating sheets extend lengthwise from said first to said second body and widthwise from corresponding first and Nth pins to corresponding Nth and first pins on said first and second bodies, respectively.

10. In a computer system having a backpanel with a front side for the mounting of printed circuit boards each with a plurality of rows of connector pins, and inversion coupler for mounting one of said printed circuit boards to the back side of said backpanel, wherein said inversion coupler comprises first and second connector bodies, said first body being engageable with the pins of the board mountable to the back side and said second body being connectable to said backpanel, wherein each of said connector bodies has a plurality of IC pins arranged in a plurality of mutually corresponding rows, and wherein the pins in each row are connected to the pins in the corresponding row in inverse order.

11. The inversion coupler of claim 10 wherein a plurality of BP pins extend through said backpanel from said front side to said back side and wherein said second body is engageable with said BP pins.

12. The inversion coupler of claim 10 wherein the IC pins in each row on said first and second connector bodies define first planes and second planes, respectively, and wherein said first and second planes are interleaved so that corresponding rows of IC pins are offset.

13. The inversion coupler of claim 12 wherein each row of IC pins has N pins, where N is an integer greater than one, and wherein the first pin in each row on said first connector body generally faces the Nth pin in the corresponding row on said second connector body, the second pin generally faces the (N−1)th pin, and so forth, and wherein each IC pin on said first connector is bent so that its pin end points in a first direction and each corresponding IC pin on said second connector is bent so that its pin end also points generally in said first direction.

14. The inversion coupler of claim 13 wherein said connector bodies are generally aligned so that a printed circuit board mounted to said back side is approximately normal to said backpanel.

15. The inversion coupler of claim 13 wherein said connector bodies are angled with respect to one another so that a printed circuit board mounted to said back side is angled with respect to said backpanel.

16. The inversion coupler of claim 13 wherein said inversion coupler further includes means for preventing said Ith IC pin in each row on said first connector body from electrically contacting all but said Ith IC pin in each corresponding row on said second connector body.

17. The inversion coupler of claim 16 wherein said means includes a plurality of insulating sheets interleaved with said first and second planes and wherein the ends of said IC pins extend beyond said sheets to where said IC pins are connected.

18. The inversion coupler of claim 17 wherein said insulating sheets extend lengthwise from said first to said second body and widthwise from corresponding first and Nth pins to corresponding Nth and first pins on said first and second bodies, respectively.

19. The inversion coupler of claim 11 wherein said backpanel has a plurality of holes extending therethrough for receiving said BP pins and wherein said BP pins are connected to a backpanel connector for mounting a printed circuit board to the front side of said backpanel.

* * * * *

UNITED STATES PATENT AND TRADEMARK OFFICE
CERTIFICATE OF CORRECTION

PATENT NO.   : 4,907,977

DATED        : March 13, 1990

INVENTOR(S)  : Warren W. Porter

It is certified that error appears in the above-identified patent and that said Letters Patent is hereby corrected as shown below:

Column 5, line 57, delete the word "and" and substitute --an--.

Signed and Sealed this

Sixteenth Day of April, 1991

Attest:

HARRY F. MANBECK, JR.

*Attesting Officer*   Commissioner of Patents and Trademarks